(12) United States Patent
Khvalkovskiy et al.

(10) Patent No.: US 9,929,339 B2
(45) Date of Patent: Mar. 27, 2018

(54) METHOD AND SYSTEM FOR PROVIDING MAGNETIC JUNCTIONS INCLUDING SELF-INITIALIZING REFERENCE LAYERS

(71) Applicant: Samsung Electronics Co., LTD., Gyeonggi-do (KR)

(72) Inventors: Alexey Vasilyevitch Khvalkovskiy, Sunnyvale, CA (US); Dmytro Apalkov, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/981,228

(22) Filed: Dec. 28, 2015

(65) Prior Publication Data

US 2016/0197264 A1 Jul. 7, 2016

Related U.S. Application Data

(60) Provisional application No. 62/099,850, filed on Jan. 5, 2015.

(51) Int. Cl.
| | | |
|---|---|---|
| H01L 43/10 | (2006.01) | |
| H01L 43/08 | (2006.01) | |
| H01L 43/12 | (2006.01) | |
| H01L 43/00 | (2006.01) | |
| H01L 29/82 | (2006.01) | |

(52) U.S. Cl.
CPC .............. *H01L 43/10* (2013.01); *H01L 43/08* (2013.01); *H01L 29/82* (2013.01); *H01L 43/00* (2013.01); *H01L 43/12* (2013.01)

(58) Field of Classification Search
CPC ......... H01L 43/02; H01L 43/08; H01L 43/10; H01L 43/12; H01L 29/82; G11B 11/161; G11B 11/1675; G11B 5/3903; G11B 5/3906; G11B 5/3909; G11B 5/3922
See application file for complete search history.

(56) References Cited

U.S. PATENT DOCUMENTS

| | | |
|---|---|---|
| 7,166,173 B2 | 1/2007 | Beach |
| 7,224,556 B2 | 5/2007 | Pinarbasi |
| 7,911,832 B2 | 3/2011 | Kent |
| 8,098,514 B2 | 1/2012 | Nagase |
| 8,351,165 B2 | 1/2013 | Carey |

(Continued)

*Primary Examiner* — Cheung Lee
*Assistant Examiner* — Stephen C Smith
(74) *Attorney, Agent, or Firm* — Convergent Law Group LLP

(57) ABSTRACT

A magnetic junction usable in a magnetic device is described. The magnetic junction includes a first reference layer, first and second spacer layers, a free layer and a self-initializing (SI) substructure. The first spacer layer is between the free and first reference layers. The free layer is switchable between stable magnetic states when a write current having at least a critical magnitude is passed through the magnetic junction. The second spacer layer is between the SI substructure and the free layer. The SI substructure is selected from first, second and third substructures. The first and second substructures include an SI reference layer having a magnetic moment switchable between the first and second directions when a current having a magnitude of not more than one-half of the critical magnitude is passed through the magnetic junction. The third substructure includes a temperature dependent reference layer.

19 Claims, 8 Drawing Sheets

(56) References Cited

U.S. PATENT DOCUMENTS

| | | | |
|---|---|---|---|
| 8,385,026 B2 | 2/2013 | Carey | |
| 8,565,010 B2 | 10/2013 | Zhou | |
| 8,623,452 B2 | 1/2014 | Zhou | |
| 9,130,155 B2* | 9/2015 | Chepulskyy | H01L 43/08 |
| 2007/0297220 A1 | 12/2007 | Yoshikawa | |
| 2012/0251845 A1* | 10/2012 | Wang | G11B 5/66 |
| | | | 428/827 |
| 2012/0319221 A1* | 12/2012 | Apalkov | H01L 43/08 |
| | | | 257/427 |
| 2013/0077389 A1 | 3/2013 | Kitagawa | |
| 2013/0161770 A1* | 6/2013 | Meng | H01L 43/02 |
| | | | 257/421 |
| 2013/0240963 A1 | 9/2013 | Beach | |
| 2014/0110604 A1 | 4/2014 | Han | |
| 2014/0145792 A1 | 5/2014 | Wang | |
| 2014/0264671 A1* | 9/2014 | Chepulskyy | H01L 43/08 |
| | | | 257/421 |
| 2016/0064651 A1* | 3/2016 | Guo | H01L 43/12 |
| | | | 257/421 |

* cited by examiner

METHOD AND SYSTEM FOR PROVIDING MAGNETIC JUNCTIONS INCLUDING SELF-INITIALIZING REFERENCE LAYERS

CROSS-REFERENCE TO RELATED APPLICATIONS

This application claims the benefit of provisional Patent Application Ser. No. 62/099,850, filed Jan. 5, 2015, entitled SPLIT iDUAL, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional reference layer 16, a conventional tunneling barrier layer 18, and a conventional free layer 20. Also shown is top contact 22. Conventional contacts 14 and 22 are used in driving the current in a current-perpendicular-to-plane (CPP) direction. Typically, the conventional reference layer 16 is closest to the substrate 12 of the layers 16, 18 and 20.

The conventional reference layer 16 and the conventional free layer 20 are magnetic. The magnetization 17 of the conventional reference layer 16 is fixed, or pinned, in a particular direction. Although depicted as a simple (single) layer, the conventional reference layer 16 may include multiple layers. For example, the conventional reference layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a SAF or other multilayer. Although shown as perpendicular-to-plane, the magnetization 21 of the conventional free layer 20 may be in plane. Thus, the reference layer 16 and free layer 20 may have their magnetizations 17 and 21, respectively oriented perpendicular to the plane of the layers.

Because of their potential for use in a variety of applications, research in magnetic memories is ongoing. For example, a lower write current may also be desired. Some of these goals may be achieved with dual magnetic junctions. Conventional dual magnetic junctions may include two reference layers, two tunneling barrier layers and a free layer. If the magnetic moments of the reference layers are in a dual state (antiparallel), then their contribution to the spin torque is additive. Thus, a lower write current may be achieved. Some dual magnetic junctions have a synthetic antiferromagnet (SAF) layer for one reference layer, a first nonmagnetic spacer layer, a free layer and a reference layer that can be aligned during writing. Such a dual magnetic junction requires the SAF for the reference layer because the magnetic field at the free layer due to other layers in the magnetic junction is desired to be at or near zero. This can be achieved with the SAF. However, this and other dual magnetic junctions may be difficult to because of their thickness. Other dual magnetic junctions have may have other drawbacks. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a first reference layer, first and second nonmagnetic spacer layers, a free layer and a self-initializing (SI) substructure. The first reference layer has a magnetic moment fixed in a first direction. The first nonmagnetic spacer layer is between the free layer and the first reference layer. The free layer is switchable between stable magnetic states when a write current having at least a critical magnitude is passed through the magnetic junction. The free layer is between the first nonmagnetic spacer layer and the second nonmagnetic spacer layer. The second nonmagnetic spacer layer is between the SI substructure and the free layer. The SI substructure is selected from a first SI substructure, a second SI substructure and a third SI substructure. The first SI substructure includes an SI reference layer, a decoupling layer and a second reference layer. The second reference layer has a second magnetic moment fixed in a second direction. The SI reference layer is between the free layer and the second reference layer. The decoupling layer is nonmagnetic and between the SI reference layer and the second reference layer. The SI reference layer has an SI magnetic moment switchable between the first direction and the second direction when a current having a magnitude of not more than one-half of the current to switch the free layer. The second SI substructure includes the SI reference layer and is usable only if the first reference layer is selected from a low saturation magnetization reference layer and an extended reference layer. The low saturation magnetization reference layer has a saturation magnetization of not more than four hundred emu/cc. The extended reference layer having a footprint larger than the free layer. The third SI substructure includes a temperature dependent reference layer. The temperature dependent reference layer having a first magnetic moment at room temperature and a second magnetic moment at a switching temperature. The first magnetic moment is in a third direction, while the second magnetic moment is in a fourth direction. The fourth direction is parallel to one of the first direction and the second direction. The second magnetic moment is also aligned antiparallel to the first direction during switching of the free layer.

DETAILED DESCRIPTION OF THE INVENTION

Figure 1:
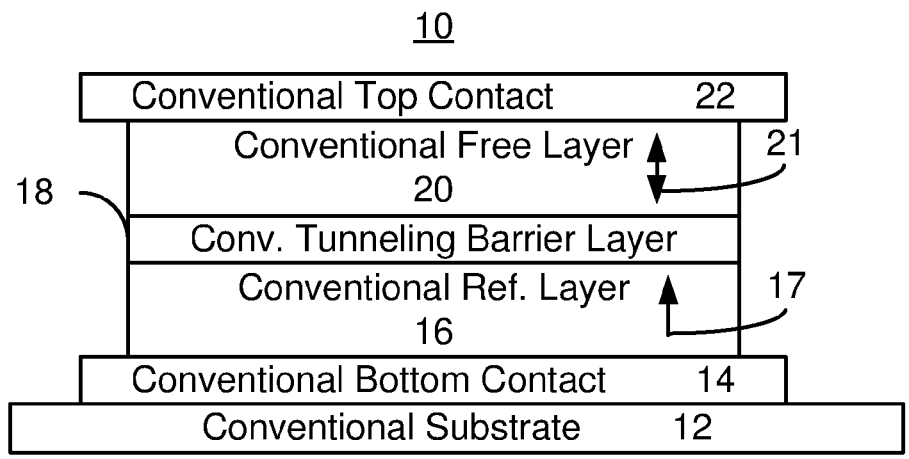
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

A magnetic junction usable in a magnetic device and a method for providing the magnetic junction are described. The magnetic junction includes a first reference layer, first and second nonmagnetic spacer layers, a free layer and a self-initializing (SI) substructure. The first reference layer has a magnetic moment fixed in a first direction. The first nonmagnetic spacer layer is between the free layer and the first reference layer. The free layer is switchable between stable magnetic states when a write current having at least a critical magnitude is passed through the magnetic junction. The free layer is between the first nonmagnetic spacer layer and the second nonmagnetic spacer layer. The second nonmagnetic spacer layer is between the SI substructure and the free layer. The SI substructure is selected from a first SI substructure, a second SI substructure and a third SI substructure. The first SI substructure includes an SI reference layer, a decoupling layer and a second reference layer. The second reference layer has a second magnetic moment fixed in a second direction. The SI reference layer is between the free layer and the second reference layer. The decoupling layer is nonmagnetic and between the SI reference layer and the second reference layer. The SI reference layer has an SI magnetic moment switchable between the first direction and the second direction when a current having a magnitude of not more than one-half of the critical current, i.e. the current to switch the free layer. The second SI substructure includes the SI reference layer and is usable only if the first reference layer is selected from a low saturation magnetization reference layer and an extended reference layer. The low saturation magnetization reference layer has a saturation magnetization of not more than four hundred emu/cc. The extended reference layer having a footprint larger than the free layer. The third SI substructure includes a temperature dependent reference layer. The temperature dependent reference layer having a first magnetic moment at room temperature and a second magnetic moment at a switching temperature. The first magnetic moment is in a third direction, while the second magnetic moment is in a fourth direction. The fourth direction is parallel to one of the first direction and the second direction. The second magnetic moment is also aligned antiparallel to the first direction during switching of the free layer.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
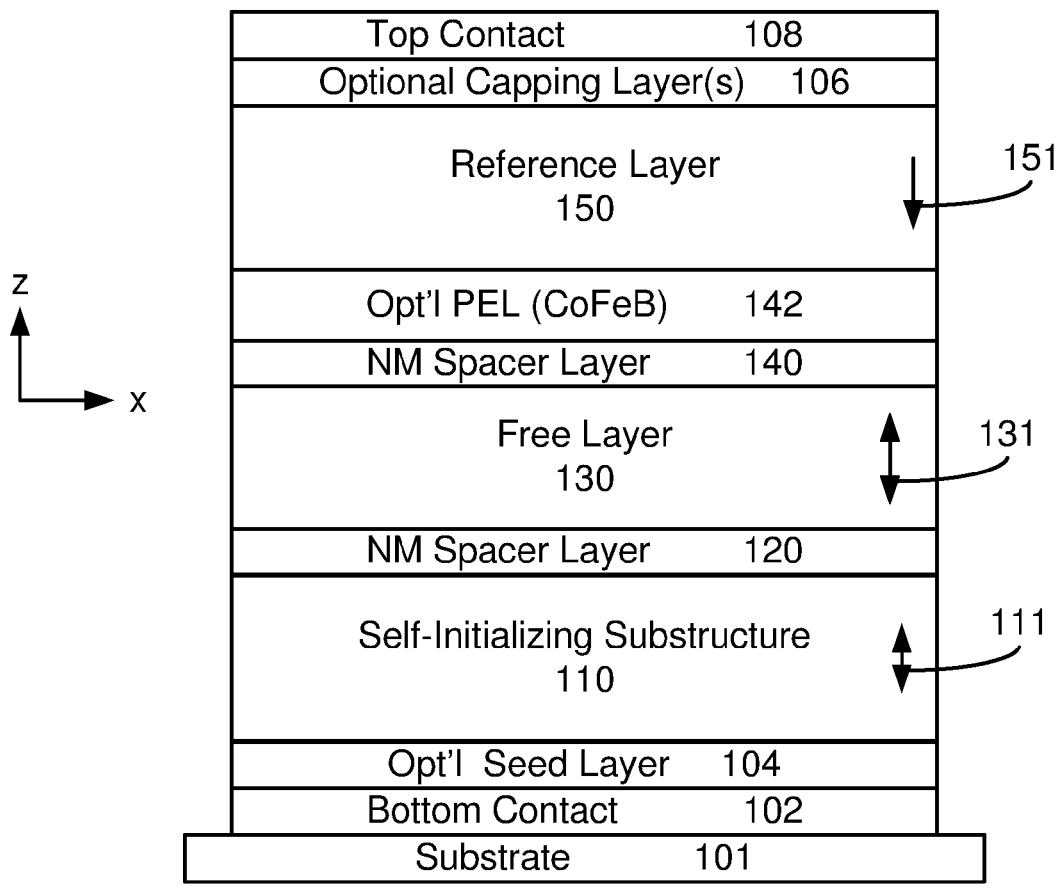
FIG. 2 depicts an exemplary embodiment of a dual magnetic junction including a self-initializing substructure that is usable in a magnetic memory programmable using spin transfer torque.

FIG. 2 depicts an exemplary embodiment of a dual magnetic junction including a self-initializing substructure. The magnetic junction 100 is usable in a magnetic memory programmable using spin transfer torque. For clarity, FIG. 2 is not to scale. The magnetic junction 100 may be used in a magnetic device such as a STT-RAM and, therefore, in a variety of electronic devices. The magnetic junction 100 is a dual magnetic junction including a reference layer 150 having magnetic moment 151, optional polarization enhancement layer (PEL) 142, nonmagnetic spacer layer 140, free layer 130 having magnetic moment 131, nonmagnetic spacer layer 120 and self-initializing (SI) substructure 110 having moment 111. Also shown is an underlying substrate 101 in which devices including but not limited to a transistor may be formed. Bottom contact 102, top contact 108, optional seed layer(s) 104 and optional capping layer(s) 106 are also shown. For example, the seed layer(s) 104 may include a thin MgO seed layer. Although the layers 110, 120, 130, 140 and 150 are shown with a particular relationship to the substrate 101, in other embodiments, the order may differ. For example, in another embodiment, from closest to furthest from the substrate 101, the layers may be 150, 140, 130, 120 and 110. An optional pinning layer (not shown) may be used to fix the magnetization (not shown) of the reference layer 150. In some embodiments, the optional pinning layer may be an AFM layer or multilayer that pins the magnetization (not shown) of the reference layer 150 by an exchange-bias interaction. However, in other embodiments, the optional pinning layer may be omitted or another structure may be used. Other layers including but not limited to other PELs having a high spin polarization, magnetic or nonmagnetic insertion layers, and/or other layers may be included in the layers of the magnetic junction 100 or be considered to be separate layers that may be used in the magnetic junction 100. However, only one such layer 142 is not shown for simplicity.

The nonmagnetic spacer layers 120 and 140 may each be an MgO tunneling barrier layer. The MgO layer may be crystalline and have a 200 orientation for enhanced tunneling magnetoresistance (TMR). In other embodiments, the nonmagnetic spacer layers 120 and 140 may be a different tunneling barrier layer, may be a conductive layer or may have another structure. In addition, nothing requires that the nonmagnetic spacer layers 120 and 140 have the same structure. For example, one of the layers 120 and 140 might be a tunneling barrier layer while the other may be a conductor. If both nonmagnetic spacer layers 120 and 140 have a similar structure, the resistances may be desired to be different in order to distinguish between the stable states of the free layer magnetic moment 131. For example, the nonmagnetic spacer layer 140 may be the main tunneling barrier layer having a higher resistance while the nonmagnetic spacer layer 120 may be a secondary tunneling barrier layer having a lower resistance.

The PEL 142 is an optional layer having a high spin polarization. For example, the PEL 142 might include Fe and/or CoFe. The PEL 142 may be between the reference layer 150 and the adjacent magnetic spacer layer 140. In other embodiments, additional and/or different PEL(s) may be included. For example, PEL(s) may be between the SI substructure 110 and the nonmagnetic spacer layer 120, between the nonmagnetic spacer layer 120 and the free layer 130 and/or between the free layer and the nonmagnetic spacer layer 140. In other embodiments, all PELs are omitted.

The reference layer 150 is magnetic and has a magnetic moment 151 that is stable throughout operation of the magnetic junction 100. Stated differently, the magnetic moment 151 of the reference layer 150 does not switch when the magnetic junction 100 is quiescent, being programmed or being read. Thus, the magnetic moment 141 is stable. The reference layer 150 may be a multilayer. Thus, the reference layer 150 layer may also include sublayers including but not limited to multiple ferromagnetic layers. The perpendicular magnetic anisotropy (PMA) energy of the reference layer 150 exceeds its out-of-plane demagnetization energy. The reference layer 150 thus has a high PMA. As used herein a high PMA is a PMA such that the PMA energy is greater than the out-of-plane demagnetization energy. Because the reference layer 150 has a high PMA, the magnetic moment 151 of the reference layer 150 may be perpendicular-to-plane. In such embodiments, a pinning layer is generally not used. For example, the reference layer 150 may include a multilayer including multiple repeats of a Co/Pt bilayer, a Co/Pd bilayer, a CoPt alloy, a CoPd alloy, a CoTb alloy and/or multiple repeats of a Co/Tb bilayer. Such combinations may have a high PMA. Similarly, the reference layer 130 may include one or more of CoFeB, FeB, CoB, Fe, $Co_2FeAl$, $Co_2FeAlSi$, $Co_2MnSi$ and MnAl, which may have a high PMA. Note that as used herein CoFeB, FeB, CoB and MnAl denote alloys in which the stoichiometry is not indicated. For example, CoFeB may include $(CoFe)_{1-x}B_x$, where x is greater than or equal to zero and less than or equal to 0.5. For example, x may be at least 0.2 and not more than 0.4. Similarly, FeB may be $Fe_{1-x}B_x$, where x is greater than or equal to zero and less than or equal to 0.5. Other materials and/or structures are having a high PMA possible for the reference layer 130.

In the embodiment shown, the reference layer 150 is ferromagnetic. For example, the multilayers discussed above include ferromagnetically coupled layers. In another embodiment, the reference layer 150 may have another structure. For example, the reference layer 150 may be a SAF. In at least some embodiments, however, the reference layer 150 excludes a SAF.

The free layer 130 is magnetic and has a perpendicular magnetic anisotropy energy that exceeds the out-of-plane demagnetization energy. The free layer thus has a high PMA. The magnetic moment 131 of the free layer 130 may thus be oriented perpendicular-to-plane as shown in FIG. 2. The magnetic junction is also configured such that the magnetic moment 131 of the free layer 110 may be switched using a write current driven through the magnetic junction (e.g. using spin transfer). In order to switch the magnetic moment 131 of the free layer 130, the write current has a critical magnitude. The critical magnitude may thus be considered the current at which the free layer magnetic moment may switch with a probability of at least fifty percent. Write currents smaller than this magnitude do not cause the free layer magnetic moment 131 to switch direction. For example, a read current driven through the magnetic junction 100 to read the state of the free layer 130 via magnetoresistance would have a magnitude less than the critical magnitude. Thus, reading the magnetic junction 100 does not disturb the state of the magnetic moment 131.

The free layer 130 may be a single layer or a multilayer. As discussed above, the free layer 130 has a PMA energy that exceeds its out-of-plane demagnetization energy. Thus, the free layer 130 may have a perpendicular-to-plane magnetic moment 131. In some embodiments, step 106 includes depositing the material(s) for the free layer. In some embodiments, the free layer may be a SAF. In other embodiments, a single layer or other multilayers may be used. The free layer may include $(CoFe)_{1-x}B_x$ layer(s), where x is at least zero less than 0.5. In some embodiments, x is at least 0.2 and not more than 0.4 as deposited. After annealing during fabrication, however, the B in the free layer 130 may be partially or completely removed. Thus, the CoFeB layer may have a different stoichiometry in the finished device than as-deposited. As used herein, CoFeB indicates a layer containing CoFe and B, preferably in the stoichiometry ranges described above as deposited, The magnetic junction 100 also includes SI substructure 110. The SI substructure 110 may function as a reference layer but does not have its magnetic moment 111 fixed. Instead, the SI substructure 110 is configured such that the magnetic moment 111 is switched to be in a dual configuration (antiparallel to the magnetic moment 151 of the reference layer 150) during programming of the free layer 130. In general, this switching occurs due to the current driven through the magnetic junction 100 during writing. However, another and/or additional mechanism(s) might be employed. In some embodiments, the magnetic moment 111 is switched to the dual configuration by a current having a magnitude of not more than one-half of the critical magnitude. In some such embodiments, the magnetic moment 111 is switched to the dual configuration by a current having a magnitude of not more than one-third of the critical magnitude. In some embodiments, the required current is not more than one-fourth of the critical magnitude. However, when the magnetic junction is quiescent (not read or programmed), the magnetic moment 111 of the SI substructure 110 may not be in the dual state. Further, the SI substructure 110 may be configured such that the stray fields at the free layer 130 due to the layers 110 and 150 is substantially zero when the magnetic junction is quiescent and when the reference layer 150 excludes a SAF. Thus, even when the reference layer 150 is ferromagnetic and/or includes ferromagnetically coupled layers, the stray fields at the free layer 130 are substantially balanced. In other embodiments, the free layer 130 may tolerate the stray field due to the layers 110 and 150, which in this case should not exceed 15% of the anisotropy field of the free layer, The SI substructure 110 is as described above because of how the SI substructure 110 is engineered. For example, the SI substructure 110 may be selected from a first SI substructure (not explicitly shown in FIG. 2), a second SI substructure (not explicitly shown in FIG. 2) and a third SI substructure (not explicitly shown in FIG. 2).

The first SI substructure includes an SI reference layer closest to the free layer 130, a second reference layer and a decoupling layer between the SI reference layer and the second reference layer. The second reference layer has a second magnetic moment that is stable, or fixed, in a direction antiparallel to the magnetic moment 151 throughout operation of the magnetic junction 100. The decoupling layer is nonmagnetic. The SI reference layer has an SI magnetic moment switchable to be antiparallel to the magnetic moment 151 when a current having a magnitude of not more than one-half of the critical magnitude is passed through the magnetic junction 100. In other embodiments, this switching may occur at lower current magnitudes, for example at currents no more than one-third or one-fourth of the critical magnitude.

The second SI substructure includes the SI reference layer described above. In some such embodiments, the second SI substructure consists of the SI reference layer and is usable only if the first reference layer 140 is selected from a low saturation magnetization reference layer and an extended reference layer. The low saturation magnetization reference layer has a saturation magnetization of not more than four hundred emu/cc. The extended reference layer has a footprint larger than the free layer. Thus, the magnetic moment of the SI reference layer may be aligned antiparallel to the magnetic moment 151 of the reference layer 150 using a current while the configuration of the reference layer allows for sufficiently low stray fields at the free layer 130.

The third SI substructure includes a temperature dependent SI reference layer. The temperature dependent SI reference layer has a magnetic moment that become either parallel or antiparallel to the magnetic moment 151 of the reference layer 150 upon heating. The magnetic moment may then be aligned using the write current as described above for the first SI substructure.

The magnetic junction 100 may have improved performance. The SI substructure 110 may provide the desired dual structure without substantially increasing the height of the stack of layers 110 through 150 for the magnetic junction 100. Further, the requirements for the components of the SI substructure 110 may be more readily obtained and formed. Thus, fabrication may be facilitated while performance is improved.

Figure 3:
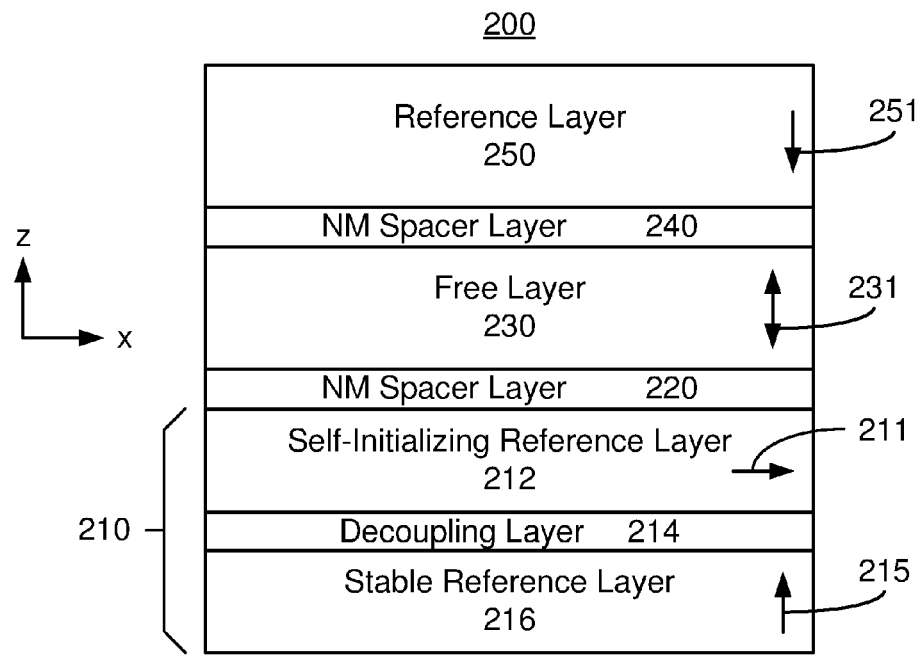
FIG. 3 depicts another exemplary embodiment of a dual magnetic junction including a self-initializing substructure that is usable in a magnetic memory programmable using spin transfer torque.

FIG. 3 depicts another exemplary embodiment of a dual magnetic junction 200 including an SI substructure that is usable in a magnetic memory programmable using spin transfer torque. For clarity, FIG. 3 is not to scale. The magnetic junction 200 may be used in a magnetic device such as a STT-RAM and, therefore, in a variety of electronic devices. The magnetic junction 200 is analogous to the magnetic junction 100. As a result, similar components have similar labels. The magnetic junction 200 includes a SI substructure 210, a nonmagnetic spacer layer 220, a free layer 230 having magnetic moment 231, a nonmagnetic spacer layer 240 and a reference layer 250 having magnetic moment 251 that are analogous to the SI substructure 110, nonmagnetic spacer layer 120, free layer 130 having magnetic moment 131, the nonmagnetic spacer layer 140, and the reference layer 150 having magnetic moment 151, respectively, depicted in FIG. 2. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 250 and the nonmagnetic spacer layer 240, between the free layer 230 and the nonmagnetic spacer layer 240, between the free layer 230 and the nonmagnetic spacer layer 220 and/or between the SI substructure 210 and the nonmagnetic spacer layer 220. In addition, although it appears as though the SI substructure 210 would be closest to the substrate (not shown in FIG. 3) and the reference layer 250 furthest from the substrate, other relationships may be possible. For example, the reference layer 250 may be closest to the substrate and the SI substructure 210 may be furthest from the substrate.

The reference layer 250 and free layer 230 each have a high PMA in the embodiment shown. Thus, the magnetic moments 251 and 231 are perpendicular to plane. In other embodiments, the magnetic moments 251 and 231 might be in plane. The free layer 230 and/or reference layer 250 may thus include one or more multilayers which are known to have a high perpendicular magnetic anisotropy. In addition, the materials selected for the free layer 230, reference layer 250 and nonmagnetic spacer layers 220 and 240 are desired to produce not only spin transfer torque programming, but also a high magnetoresistance. For example, the nonmagnetic spacer layers 220 and 240 may be crystalline MgO having the desired (e.g. 200) orientation and the free layer 230 and reference layer 250 may include CoFe and/or CoFeB. The magnetic moment 231 of the free layer 230 is programmable using a current driven through the magnetic junction 200 in a perpendicular-to-plane direction (i.e. along the z-axis). As discussed herein, currents are driven through a magnetic junction is driven perpendicular-to-plane unless otherwise noted. The magnetic moment 231 switches for a write current having a critical magnitude or more.

The SI substructure 210 is analogous to the first SI substructure described above with respect to the magnetic junction 100. The SI substructure 210 includes an SI reference layer 212, a decoupling layer 214 and a reference layer 216. The reference layer 216 has magnetic moment 215. In the embodiment shown, the reference layers 250 and 216 are in a dual state. Thus, the magnetic moments 251 and 215 are antiparallel. As a result, the magnetic fields due to the structures 210 and 250 may substantially cancel at the free layer 230. Stated differently, the free layer 230 may be relatively free of magnetic fields without requiring the reference layer 250 to be a SAF. The reference layer 216 has a high PMA, allowing the magnetic moment 215 to be perpendicular to plane. For example, the reference layer 216 may include n repeats of a TbCo/FeB bilayer and/or m repeats of a CoFe/PtPd bilayer, where n and m are each integers. In other embodiments, the magnetic moment 215 may be in plane. In general, however, the magnetic moment 215 is desired to be antiparallel to the magnetic moment 251.

The magnetic moment 215 of the reference layer 216 is also stable throughout operation of the magnetic junction 200. In this manner, the reference layer 216 is analogous to the reference layer 250. The magnetic moments 251 and 215 thus remain substantially fixed when the magnetic junction 200 is read, programmed, or in standby mode.

The decoupling layer 214 is nonmagnetic. The decoupling layer 214 magnetically decouples the SI reference layer 212 from the reference layer 216. Thus, the SI reference layer magnetic moment 211 may be switched during programming as described below. The SI substructure 210 is not a SAF. The decoupling layer 214 may also be desired to structurally decouple the SI reference layer 212 from the reference layer 216. Thus, the SI reference layer 212 may have a different crystal structure from the reference layer 216. In some embodiments, the decoupling layer 214 is also a diffusion blocking layer. Thus, the decoupling layer 214 may be a sink for materials, such as Tb, Pt, Pd and/or B, that are present in the underlying reference layer 216 and which may diffuse during anneals performed during fabrication of the magnetic junction 200. Materials that may be used in the decoupling layer 214 to fulfill these functions may include at least one of Co, Fe, B, Ta, V, W, Mg, and MgO. For example, the decoupling layer 214 may include one or more of a CoFeBTa layer, a Fe/Ta bilayer, a CoFeBTa/Mg bilayer, a CoFeBTa/MgO bilayer, a $[Fe/Ta]_x Mg$ multilayer and a $[Fe/Ta]_x/MgO$ multilayer where x is an integer. In some embodiments, for example, the SI substructure may include one or more of CoFe, CoFeB, CoFeV, CoFeTa with Ta content less than thirty atomic percent. Note that the stoichiometries of the constituents are not indicated in the materials listed for the decoupling layer 214. In general, however, it is desirable to have at least ten atomic percent and not more than thirty atomic percent of the nonmagnetic metal such as Ta and from zero atomic percent through not more than fifty atomic percent of B.

The SI reference layer 212 has a changeable magnetic moment 211, provides spin transfer torque and has low damping. For example, the SI reference layer 212 may include or consist of a $(CoFe)_{1-x}B_x$ layer, where x is not more than 0.5. In some embodiments, x is at least 0.2 and not more than 0.4. The above stoichiometries are as-deposited. After fabrication is complete, the CoFeB layer described above may be B poor due to diffusion during annealing and/or removal of B.

The magnetic moment 211 of the SI reference layer 212 is in one direction when no current is driven through the magnetic junction 200, but in another direction when a sufficient current is driven through the magnetic junction 200. FIG. 3 depicts the magnetic junction 200 in the absence of a write current. Thus, in the embodiment shown in FIG. 3, the magnetic moment 211 is in-plane when the magnetic junction 200 is quiescent. In some embodiments, the magnetic moment 211 remains in-plane when a read current is driven through the magnetic junction 200. In other embodiments, the magnetic moment 211 is perpendicular-to-plane when the read current is driven through the magnetic junction 200. The orientation of the magnetic moment 211 during reading depends upon the minimum current to switch the magnetic moment 211 and the magnitude of the read current.

The magnetic moment 211 switches to antiparallel to the magnetic moment 251 when a current having a particular magnitude is driven through the magnetic junction 200 in the perpendicular-to-plane direction. The magnetic moment remains antiparallel as long as the current is greater than this magnitude. In some embodiments, the magnetic moment 211 switches when a current having a magnitude of not more than one-half of the critical magnitude is passed through the magnetic junction 200. Thus, for currents meeting or exceeding this magnitude, the magnetic moment 211 is in the dual state with the magnetic moment 251. In other embodiments, this alignment may occur at lower current magnitudes. In some embodiments, the magnetic moment 211 may switch to be antiparallel to the magnetic moment 251 at a current having a magnitude of not more than one-third of the critical magnitude. The magnetic moment 211 may align antiparallel to the magnetic moment 251 at a current having a magnitude of not more than one-fourth of the critical magnitude. In some embodiments, the magnetic moment 211 remains in the same direction as the standby mode unless the current driven through the magnetic junction 200 exceeds one tenth of the critical magnitude. The switching of the magnetic moment 211 may also be substantially symmetric. Thus, a current driven in the positive z-direction (from the SI substructure 210 to the reference layer 250) aligns the magnetic moment 211 in the dual state at substantially the same magnitude as a current driven in the negative z-direction (from the reference layer 250 to the SI substructure 210).

Operation of the magnetic junction 200 may be understood in conjunction with FIGS. 4A-4D and FIGS. 5A-5D. FIGS. 4A-4D depicts an exemplary embodiment of the magnetic moments for the magnetic junction 200 during programming using a current driven in the positive z direction (from the SI substructure 210 to the reference layer 250). Such a write current is used to switch the free layer magnetic moment 231 from antiparallel to parallel to the magnetic moment 251. FIGS. 5A-5D depicts an exemplary embodiment of the magnetic moments for the magnetic junction 200 during programming using a current driven in the negative z direction (from the reference layer 250 to the SI substructure 210). This current is used to switch the free layer magnetic moment 231 from parallel to antiparallel to the magnetic moment 251. Referring to FIGS. 3-5D, when no current is driven through the magnetic junction, the magnetic moments are as shown in FIG. 3.

Figures 4A, 4B, 4C, 4D:
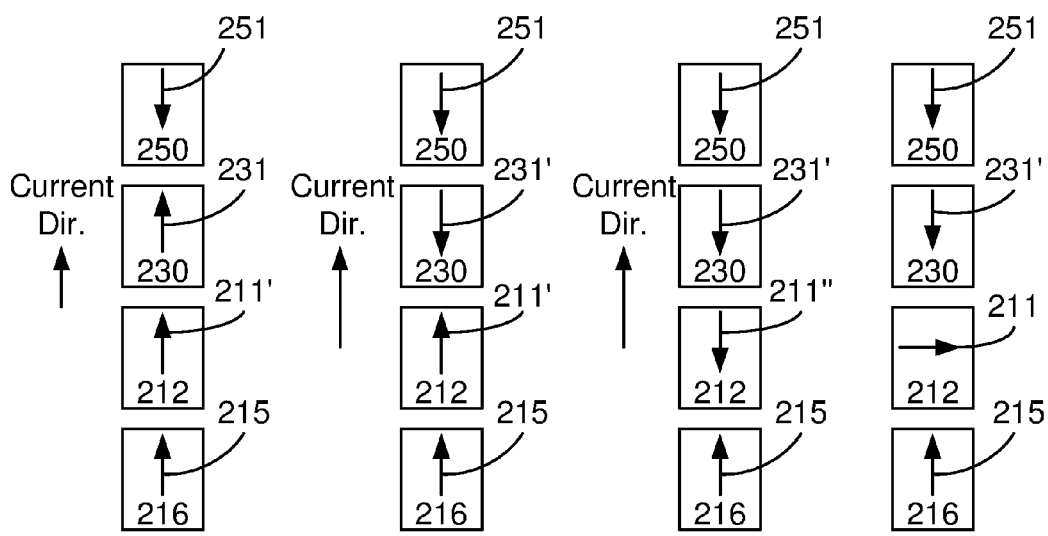
FIGS. 4A-4D depicts an exemplary embodiment of the magnetic moments during programming in a dual magnetic junction including a self-initializing substructure that is usable in a magnetic memory programmable using spin transfer torque.

A write current may be driven through the magnetic junction 200 in the positive z direction to program the free layer 230 to have its magnetic moment 231 parallel to the magnetic moment 251. The current through the magnetic junction has some rise time. When the current is greater than the current required to switch the SI reference layer 212 but less than the critical magnitude, the magnetic moment 211 aligns antiparallel to the reference layer 251. This situation is shown in FIG. 4A. The magnetic moment 211' of the SI reference layer 212 has switched to align antiparallel to the magnetic moment 251 due to spin transfer torque (STT) from the free layer 230. This switching occurs because current carriers (e.g. electrons) traveling from the free layer 230 to the SI reference layer 212 are spin polarized in the direction of the magnetic moment 231. Thus, STT switches the magnetic moment 211' of the SI reference layer 212 to antiparallel to the magnetic moment 251. The magnetic junction 200 is in the dual state.

The write current continues to increase to its critical value. The free layer magnetic moment 231 switches to be parallel to the magnetic moment 251 of the reference layer due at least in part to STT. In this case, the STT comes from current carriers polarized in the direction of the magnetic moment 251 of the reference layer 250. In addition, current carries having their spins aligned antiparallel to the magnetic moment 211' of the SI reference layer 212 tend to be scattered back to the free layer 230 by the SI reference layer 212. Thus, the STT from the write current is further increased. This is a benefit of the dual configuration in which the moments 211' and 251 are antiparallel. The free layer magnetic moment 231' is programmed to be parallel to the reference layer magnetic moment 251. This situation is shown in FIG. 4B. The write current may be reduced.

Because the free layer magnetic moment 231 is switched, the STT on the SI reference layer 212 changes direction. Thus, the magnetic moment 211' of the SI reference layer 212 may reverse direction. This is shown in FIG. 4C. Thus, the magnetic moment 211" is parallel to the free layer magnetic moment 231' and to the reference layer magnetic moment 251. However, the free layer magnetic moment 231' remains parallel to the magnetic moment 251 of the reference layer.

Once the write current is reduced to below the switching magnitude for the SI reference layer 212, the magnetic moment 211" reverts back to its original state. This situation is shown in FIG. 4D. Thus, the magnetic moment 211 of the SI reference layer 212 is in-plane. However, the free layer magnetic moment 231' is now parallel to the magnetic moment 251 of the reference layer.

Figures 5A, 5B, 5C, 5D:
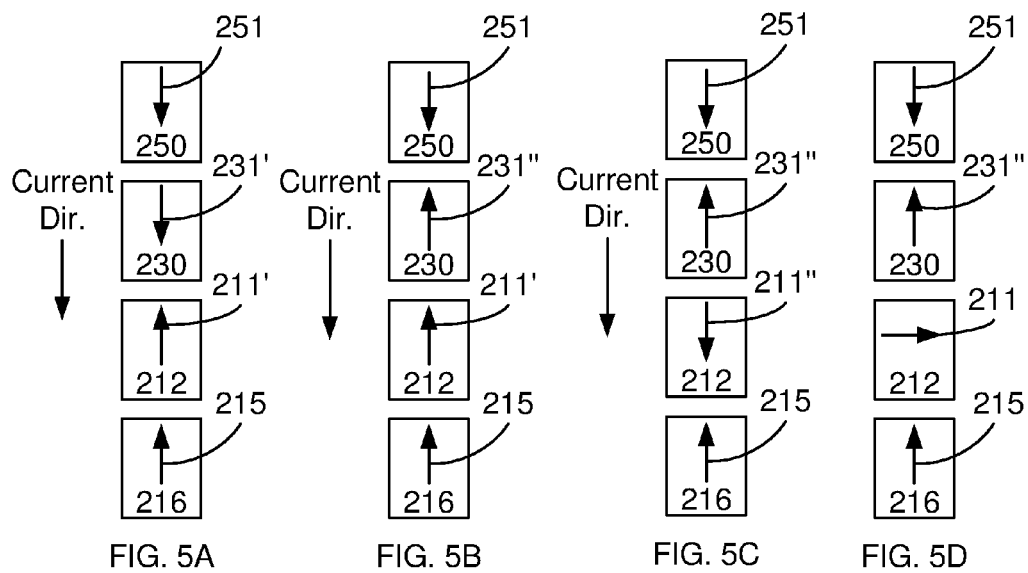
FIGS. 5A-5D depicts an exemplary embodiment of the magnetic moments during programming in a dual magnetic junction including a self-initializing substructure that is usable in a magnetic memory programmable using spin transfer torque.

To program the free layer 230 to have its magnetic moment 231 antiparallel to the magnetic moment 251, the write current may be driven through the magnetic junction 200 in the negative z direction. The current through the magnetic junction has some rise time. When the current magnitude is greater than the current required to switch the SI reference layer 212 but less than the critical magnitude for the free layer 230, the magnetic moment 211 aligns parallel to the reference layer 251. This situation is shown in FIG. 5A. The magnetic moment 211' of the SI reference layer 212 has switched to align antiparallel to the magnetic moment 251 due to STT from the free layer 230. This switching occurs because current carriers traveling from the SI reference layer 212 to the free layer 230 and that are spin polarized opposite to the direction of the magnetic moment 231' tend to be scattered back toward the SI reference layer. Thus, STT switches the magnetic moment 211' of the SI reference layer 212 to antiparallel to the magnetic moment 251. The magnetic junction 200 is in the dual state.

The write current continues to increase to its critical value. The free layer magnetic moment 231' switches to be parallel to the magnetic moment 251 of the reference layer 250 due at least in part to STT. In this case, the STT comes from current carries having their spins aligned parallel to the magnetic moment 211' of the SI reference layer 212. These current carriers are polarized with their spins opposite to the direction of the magnetic moment 251 of the reference layer 250. In addition, current carriers scattered back from the reference layer 250 also tend to have their spins aligned antiparallel to the magnetic moment 251. Thus, the STT from the write current is further increased. This is a benefit of the dual configuration. The free layer magnetic moment 231" is programmed to be parallel to the reference layer magnetic moment 251. This situation is shown in FIG. 5B. The write current may be reduced.

Because the free layer magnetic moment 231" is switched, the STT on the SI reference layer 212 changes direction. Thus, the magnetic moment 211' of the SI reference layer 212 may reverse direction. This is shown in FIG.

5C. Thus, the magnetic moment 211" is parallel to the free layer magnetic moment 231" and to the reference layer magnetic moment 251. However, the free layer magnetic moment 231" remains antiparallel to the magnetic moment 251 of the reference layer.

Once the write current is reduced to below the switching magnitude for the SI reference layer 212, the magnetic moment 211" reverts back to its original state. This situation is shown in FIG. 5D. Thus, the magnetic moment 211 of the SI reference layer 212 is in-plane. However, the free layer magnetic moment 231" is now antiparallel to the magnetic moment 251 of the reference layer.

The magnetic junction 200 may have improved performance. The SI substructure 210 may provide the desired dual configuration for the magnetic moments 211' and 251 without substantially increasing the height of the stack of layers 210 through 250 for the magnetic junction 200. Further, the requirements for the components of the SI substructure 210 may be more readily obtained and formed. For example, the reference layer 216 need not be strongly coupled with the SI reference layer 212. In addition, the magnetic fields at the free layer 230 from the layers 212, 216 and 250 may be substantially balanced without requiring the reference layer 250 to be a SAF. Thus, fabrication may be facilitated while performance is improved.

Figure 6:
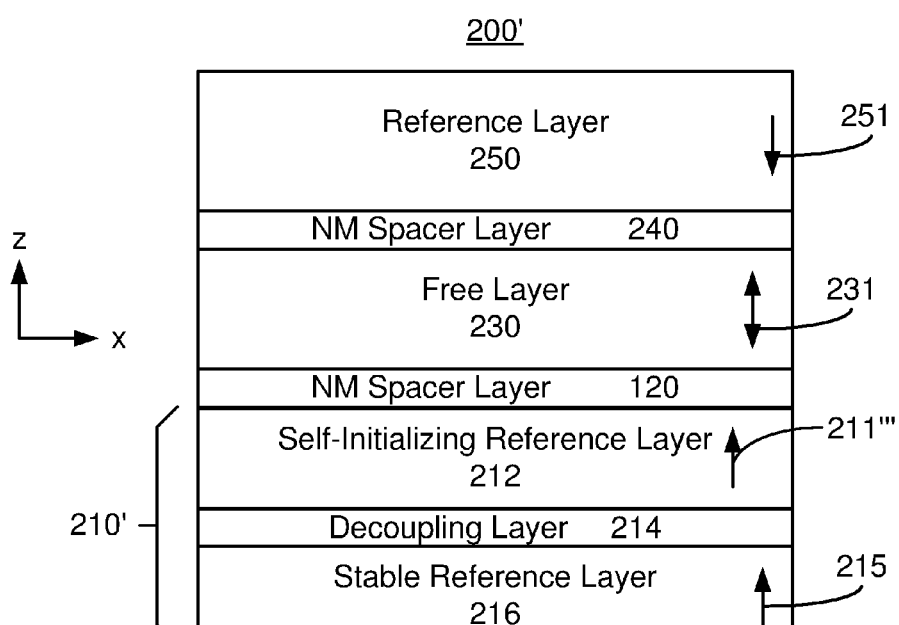
FIG. 6 depicts another exemplary embodiment of a dual magnetic junction including a self-initializing substructure that is usable in a magnetic memory programmable using spin transfer torque.

FIG. 6 depicts another exemplary embodiment of a dual magnetic junction 200' including a self-initializing substructure that is usable in a magnetic memory programmable using spin transfer torque. For clarity, FIG. 6 is not to scale. The magnetic junction 200' may be used in a magnetic device such as a STT-RAM and, therefore, in a variety of electronic devices. The magnetic junction 200' is analogous to the magnetic junctions 100 and 200. As a result, similar components have similar labels. The magnetic junction 200' includes a SI substructure 210', a nonmagnetic spacer layer 220, a free layer 230 having magnetic moment 231, a nonmagnetic spacer layer 240 and a reference layer 250 having magnetic moment 251 that are analogous to the SI substructure 110/210, nonmagnetic spacer layer 120/220, free layer 130/230 having magnetic moment 131/231, the nonmagnetic spacer layer 140/240, and the reference layer 150/250 having magnetic moment 151/251, respectively, depicted in FIGS. 2 and 3. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 250 and the nonmagnetic spacer layer 240, between the free layer 230 and the nonmagnetic spacer layer 240, between the free layer 230 and the nonmagnetic spacer layer 220 and/or between the SI substructure 210' and the nonmagnetic spacer layer 220. In addition, although it appears as though the SI substructure 210' would be closest to the substrate (not shown in FIG. 6) and the reference layer 250 furthest from the substrate, other relationships may be possible. For example, the reference layer 250 may be closest to the substrate and the SI substructure 210' may be furthest from the substrate.

The magnetic junction 200' operates in an analogous manner to the magnetic junction 200. However, the direction of the magnetic moment 211''' of the SI reference layer 212 not in-plane in the absence of a current being driven through the magnetic junction 200'. This can be seen in FIG. 6, which depicts the magnetic junction 200' in the absence of a write current. Instead of being in-plane, the magnetic moment 211''' is perpendicular-to-plane when no current is driven through the magnetic junction 200'. The magnetic moment 211''' still undergoes switching in a manner analogous to that described above with respect to FIGS. 4A-4C and 5A-5C.

The magnetic junction 200' shares the benefits of the magnetic junction 200. Thus, fabrication of the magnetic junction 200' may be facilitated while performance is improved.

Figure 7:
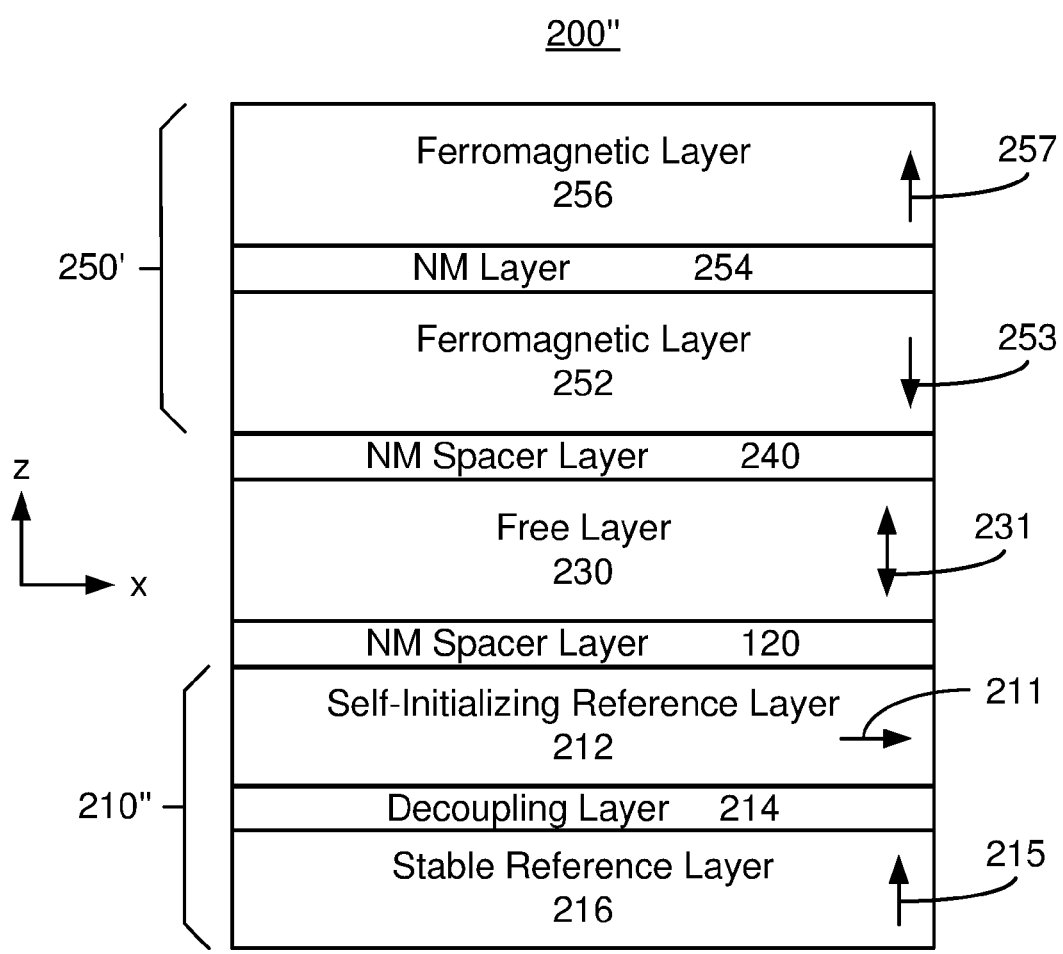
FIG. 7 depicts another exemplary embodiment of a dual magnetic junction including a self-initializing substructure that is usable in a magnetic memory programmable using spin transfer torque.

FIG. 7 depicts another exemplary embodiment of a dual magnetic junction 200" including a self-initializing substructure that is usable in a magnetic memory programmable using spin transfer torque. For clarity, FIG. 7 is not to scale. The magnetic junction 200" may be used in a magnetic device such as a STT-RAM and, therefore, in a variety of electronic devices. The magnetic junction 200" is analogous to the magnetic junctions 100, 200 and 200'. As a result, similar components have similar labels. The magnetic junction 200" includes a SI substructure 210, a nonmagnetic spacer layer 220, a free layer 230 having magnetic moment 231, a nonmagnetic spacer layer 240 and a reference layer 250' that are analogous to the SI substructure 110/210/210', nonmagnetic spacer layer 120/220, free layer 130/230 having magnetic moment 131/231, the nonmagnetic spacer layer 140/240, and the reference layer 150/250 having magnetic moment 151/251, respectively, depicted in FIGS. 2, 3 and 6. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 250' and the nonmagnetic spacer layer 240, between the free layer 230 and the nonmagnetic spacer layer 240, between the free layer 230 and the nonmagnetic spacer layer 220 and/or between the SI substructure 210 and the nonmagnetic spacer layer 220. In addition, although it appears as though the SI substructure 210' would be closest to the substrate (not shown in FIG. 7) and the reference layer 250 furthest from the substrate, other relationships may be possible. For example, the reference layer 250 may be closest to the substrate and the SI substructure 210' may be furthest from the substrate. The magnetic junction 200" operates in an analogous manner to the magnetic junctions 200 and 200'. The magnetic moment 211 still undergoes switching in a manner analogous to that described above with respect to FIGS. 4A-4C and 5A-5C.

In the embodiment shown, the reference layer 250' is a SAF. Thus, the reference layer 250' includes ferromagnetic layers 252 and 256 separated by the nonmagnetic layer 254 that may be Ru. Thus, the magnetic moments 253 and 257 of the layers 252 and 256, respectively, are antiferromagnetically coupled.

The magnetic junction 200" shares the benefits of the magnetic junction(s) 200 and 200'. Thus, fabrication of the magnetic junction 200" may be facilitated while performance is improved.

Figure 8:
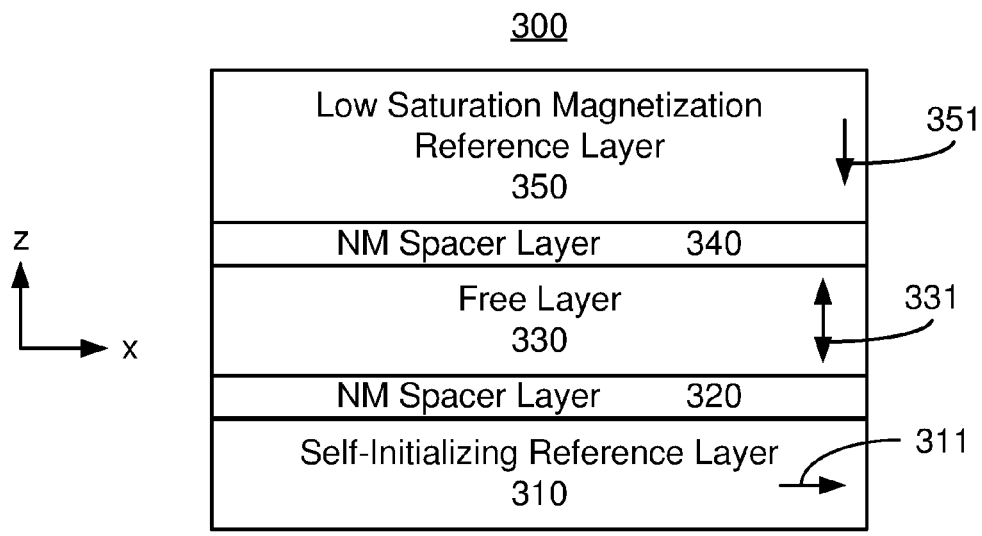
FIG. 8 depicts another exemplary embodiment of a dual magnetic junction including a self-initializing substructure that is usable in a magnetic memory programmable using spin transfer torque.

FIG. 8 depicts another exemplary embodiment of a dual magnetic junction 300 including an SI substructure that is usable in a magnetic memory programmable using spin transfer torque. For clarity, FIG. 8 is not to scale. The magnetic junction 300 may be used in a magnetic device such as a STT-RAM and, therefore, in a variety of electronic devices. The magnetic junction 300 is analogous to the magnetic junction 100. As a result, similar components have similar labels. The magnetic junction 300 includes a SI substructure 310, a nonmagnetic spacer layer 320, a free layer 330 having magnetic moment 331, a nonmagnetic spacer layer 340 and a reference layer 350 having magnetic moment 351 that are analogous to the SI substructure 110, nonmagnetic spacer layer 120, free layer 130 having magnetic moment 131, the nonmagnetic spacer layer 140, and the reference layer 150 having magnetic moment 151, respectively, depicted in FIG. 2. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 350 and the nonmagnetic spacer layer 340, between the free layer 330 and the nonmagnetic spacer layer 340, between the free layer 330 and the nonmagnetic spacer layer 320 and/or between the SI substructure 310 and the nonmagnetic spacer layer 320. In addition, although it appears as though the SI substructure 310 would be closest to the substrate (not shown in FIG. 8) and the reference layer 350 furthest from the substrate, other relationships may be possible. For example, the reference layer 350 may be closest to the substrate and the SI substructure 310 may be furthest from the substrate.

The reference layer 350 and free layer 330 each have a high PMA in the embodiment shown. Thus, the magnetic moments 351 and 331 are perpendicular to plane. In other embodiments, the magnetic moments 351 and 331 might be in plane. The free layer 330 and/or reference layer 350 may thus include one or more multilayers which are known to have a high perpendicular magnetic anisotropy. In addition, the materials selected for the free layer 330, reference layer 350 and nonmagnetic spacer layers 320 and 340 are desired to produce not only spin transfer torque programming, but also a high magnetoresistance. For example, the nonmagnetic spacer layers 320 and 340 may be crystalline MgO having the desired (e.g. 200) orientation and the free layer 330 may include CoFe and/or CoFeB. The magnetic moment 331 of the free layer 330 is programmable using a current driven through the magnetic junction 300 in a perpendicular-to-plane direction (i.e. along the z-axis). A write current driven through a magnetic junction is driven perpendicular-to-plane unless otherwise noted. The magnetic moment 331 switches for a write current having a critical magnitude.

The SI substructure 310 is analogous to the second SI substructure described above. Thus, the SI substructure 310 is, therefore, an SI reference layer 310. The SI reference layer 310 has a changeable magnetic moment 311, provides spin transfer torque and has low damping. For example, the SI reference layer 310 may include or consist of a $(CoFe)_{1-x}B_x$ layer, where x is not more than 0.5. In some embodiments, x is at least 0.2 and not more than 0.4. The above stoichiometries are as-deposited. After fabrication is complete, the CoFeB layer described above may be B poor due to diffusion and/or removal of B.

The magnetic moment 311 of the SI reference layer 310 is in one direction when no current is driven through the magnetic junction 300, but in another direction when a sufficient current is driven through the magnetic junction 300. FIG. 8 depicts the magnetic junction 300 in the absence of a write current. Thus, in the embodiment shown in FIG. 8, the magnetic moment 311 is in-plane when the magnetic junction 300 is quiescent/in standby. In an alternate embodiment, the magnetic moment 311 may be perpendicular to plane when the magnetic junction 300 is in standby mode. However, in either case, the magnetic moment 311 switches to be antiparallel to the magnetic moment 351 during writing, as discussed below. In some embodiments, the magnetic moment 311 remains in the same state when a read current is driven through the magnetic junction 300. In other embodiments, the magnetic moment 311 is in the dual state (antiparallel o the magnetic moment 351) when the read current is driven through the magnetic junction 300. The orientation of the magnetic moment 311 during reading depends upon the minimum current to switch the magnetic moment 311 and the magnitude of the read current.

The SI reference layer 310 functions in an analogous manner to the SI reference layer 212 depicted in FIGS. 3, 6 and 7. The magnetic moment 311 switches to antiparallel to the magnetic moment 351 when a current having a particular magnitude is driven through the magnetic junction 300 in the perpendicular-to-plane direction. The magnetic moment remains antiparallel as long as the current is greater than this magnitude. In some embodiments, the magnetic moment 311 switches when a current having a magnitude of not more than one-half of the critical magnitude is passed through the magnetic junction 300. Thus, for currents meeting or exceeding this magnitude, the magnetic moment 311 is in the dual state with the magnetic moment 351. In other embodiments, this alignment may occur at lower current magnitudes. In some embodiments, the magnetic moment 311 may align antiparallel to the magnetic moment 351 at a current having a magnitude of not more than one-third of the critical magnitude. The magnetic moment 311 may align antiparallel to the magnetic moment 351 at a current having a magnitude of not more than one-fourth of the critical magnitude. In some embodiments, the magnetic moment 311 remains in the same direction as the standby mode unless the current driven through the magnetic junction 300 exceeds one tenth of the critical magnitude. The switching of the magnetic moment 311 may also be substantially symmetric. Thus, a current driven in the positive z-direction (from the SI reference layer 310 to the reference layer 350) switches the magnetic moment 311 at substantially the same magnitude as a current driven in the negative z-direction (from the reference layer 350 to the SI substructure 310).

In addition, use of the SI substructure/reference layer 310 may place constraints on the reference layer 350. The stray magnetic fields due to the other layers in the magnetic junction 300 are desired to substantially balance at the free layer 330. This allows the free layer magnetic moment 331 to be free to be programmed using STT. Because the SI reference layer 310 is not stable in the dual state when the magnetic junction 300 is in the standby mode, the magnetic fields from the magnetic moment 311 may not balance the magnetic fields due to the reference layer 350. In order to mitigate the magnetic fields to which the free layer 310 is subject, the saturation magnetization of the reference layer 350 is desired to be low. More specifically, the saturation magnetization of the reference layer 350 not more than four hundred emu/cc. In some embodiments, the saturation magnetization of the reference layer 350 does not exceed two hundred emu/cc. In some other embodiments, the saturation magnetization of the reference layer 350 does not exceed one hundred emu/cc. Thus, materials having low saturation magnetization, such as GeMn, are used for the reference layer 350.

As discussed above, the magnetic junction 300 and SI reference layer 310 function in an analogous manner to the magnetic junctions 100, 200, 200' and/or 200". Thus, the magnetic moment 311 of the SI reference layer 310 switches to be antiparallel to the magnetic moment 351 at a lower current than the free layer 330 undergoes switching. Thus, the SI reference layer 310 automatically aligns to the dual state during programming of the free layer. The magnetic junction 300 may, therefore, have improved performance. The SI substructure 310 may provide the desired dual configuration for the magnetic moments 311 and 351 without substantially increasing the height of the stack of layers 310 through 350 for the magnetic junction 300. Further, the requirements for the components of the SI substructure 310 may be more readily obtained and formed. In addition, the magnetic fields at the free layer 330 from the layers 310 and 350 may be sufficiently balanced (i.e. small) without requiring the reference layer 350 to be a SAF. Thus, fabrication may be facilitated while performance is improved.

Figure 9:
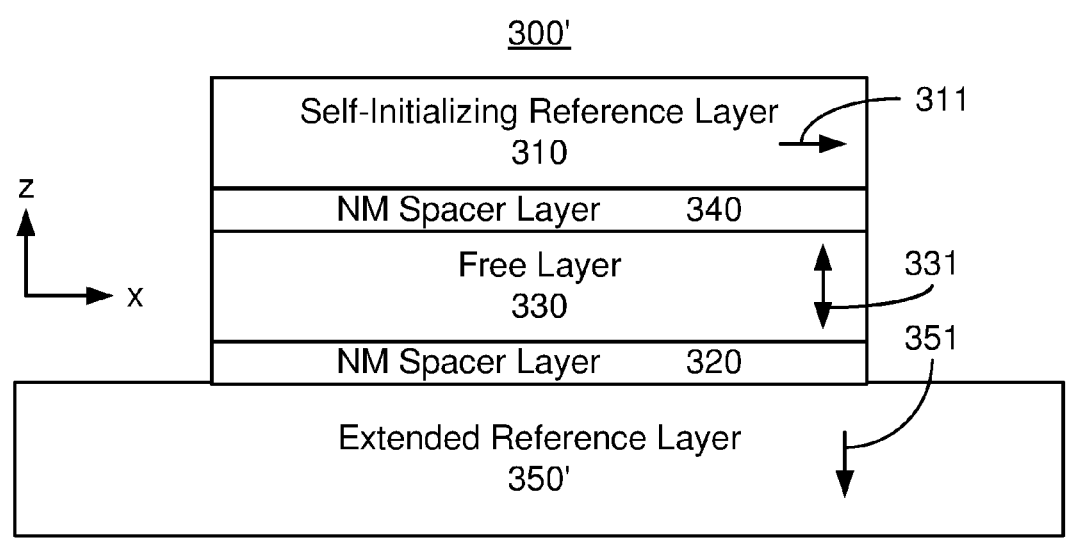
FIG. 9 depicts another exemplary embodiment of a dual magnetic junction including a self-initializing substructure that is usable in a magnetic memory programmable using spin transfer torque.

FIG. 9 depicts another exemplary embodiment of a dual magnetic junction 300' including a self-initializing substructure that is usable in a magnetic memory programmable using spin transfer torque. For clarity, FIG. 9 is not to scale. The magnetic junction 300' may be used in a magnetic device such as a STT-RAM and, therefore, in a variety of electronic devices. The magnetic junction 30' is analogous to the magnetic junctions 100, 200, 200', 200" and 300. As a result, similar components have similar labels. The magnetic junction 300' includes a SI substructure 310, a nonmagnetic spacer layer 320, a free layer 330 having magnetic moment 331, a nonmagnetic spacer layer 340 and a reference layer 350' having magnetic moment 351 that are analogous to the SI substructure 110/310, nonmagnetic spacer layer 120/320, free layer 130/330 having magnetic moment 131/331, the nonmagnetic spacer layer 140/340, and the reference layer 150/350 having magnetic moment 151/351, respectively, depicted in FIGS. 2 and 8. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 350' and the nonmagnetic spacer layer 340, between the free layer 330 and the nonmagnetic spacer layer 340, between the free layer 330 and the nonmagnetic spacer layer 320 and/or between the SI substructure 310 and the nonmagnetic spacer layer 320. In addition, although it appears as though the SI substructure 310 would be furthest from the substrate (not shown in FIG. 9) and the reference layer 350' closest to the substrate, other relationships may be possible. For example, the reference layer 350 may be furthest from the substrate and the SI substructure 310 may be closest to the substrate.

The magnetic junction 300' operates in an analogous manner to the magnetic junction 300. Thus, the SI substructure 310 is an SI reference layer 310 that aligns to be antiparallel to the magnetic moment 351 during switching. Although shown as in plane in the standby mode in FIG. 9, in other embodiments, the magnetic moment 311 may be perpendicular-to-plane when the magnetic junction 300' is quiescent. However, the magnetic moment 311 may not be stable without a sufficient current driven through the magnetic junction 300' to align the magnetic moment 311 antiparallel to the magnetic moment 351.

The reference layer 350' is an extended reference layer 350'. Thus, the footprint of the extended reference layer 350' is larger than that of the free layer 330. Thus, as shown in FIG. 9, the extended reference layer 350' extends further in the x-direction than the free layer 330. In some embodiments, the extended reference layer 350' extends further in the y-direction (perpendicular to the plane of the page) than the free layer 330. In other embodiments, the extended reference layer 350' extends further in the x-direction and the y-direction than the free layer 330. In some embodiments, the extended reference layer 350' has dimensions at least twice that of the free layer 330 in the x and/or y directions. However, other dimensions are possible.

As in the magnetic junction 300, use of the SI substructure/reference layer 310 may place constraints on the reference layer 350'. In particular, the stray fields at the free layer 330 are desired to be sufficiently balanced. Because the reference layer 350' is an extended reference layer 350', the magnetic fields due to the extended reference layer 350' substantially balance at the free layer 330. The reference layer 350' need not have a low saturation magnetization in order for the stray fields at the free layer 330 to be substantially balanced.

The magnetic junction 300' shares the benefits of the magnetic junction 300. Thus, fabrication of the magnetic junction 300' may be facilitated while performance is improved.

Figure 10A:
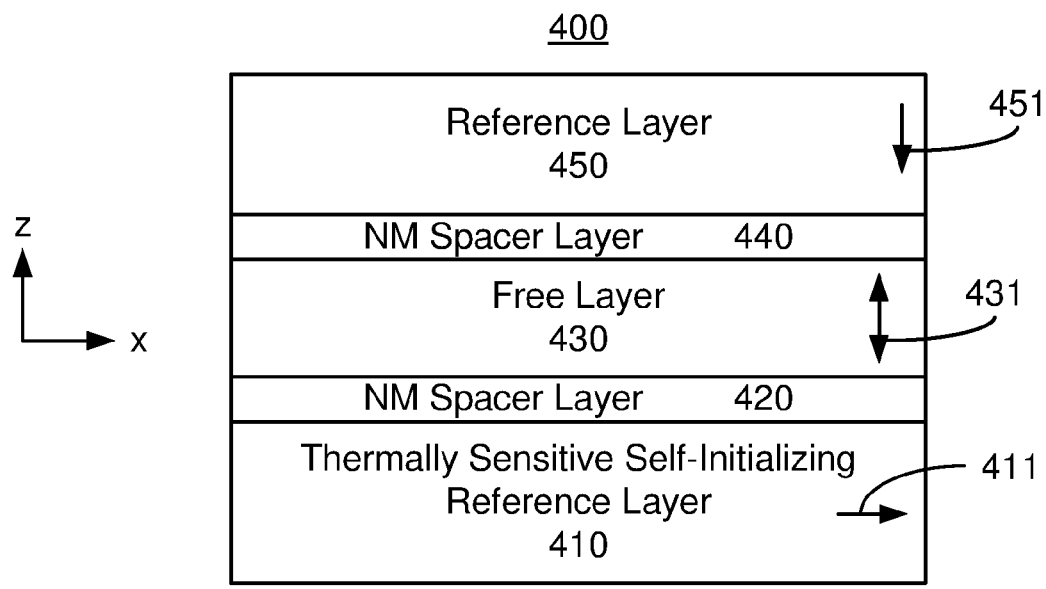
FIGS. 10A and 10B depict another exemplary embodiment of a dual magnetic junction including a self-initializing substructure that is usable in a magnetic memory programmable using spin transfer torque during switching.
Figure 10B:
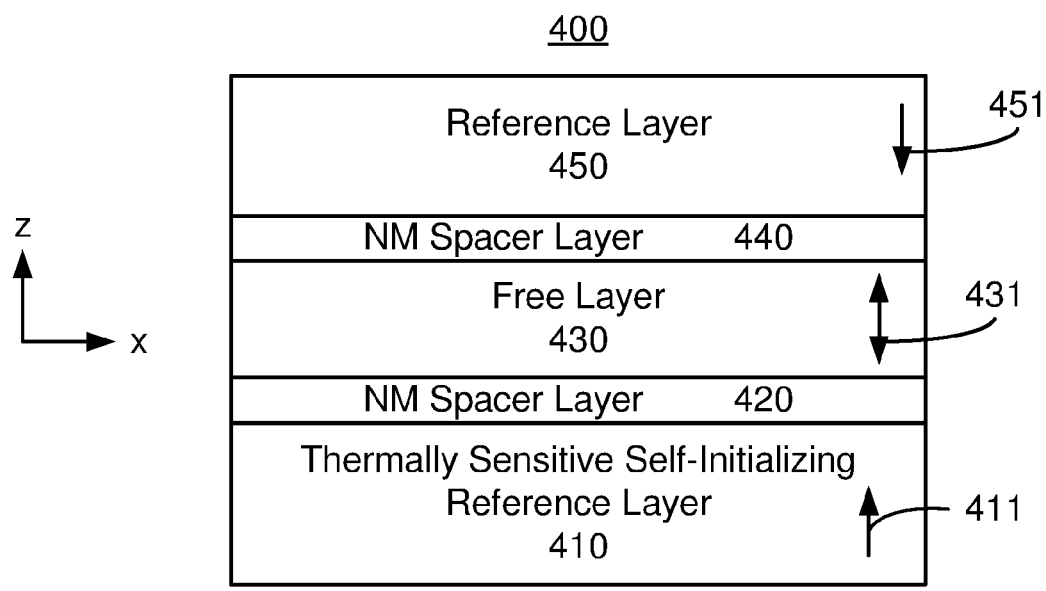

FIGS. 10A and 10B depict another exemplary embodiment of a dual magnetic junction 400 including a SI substructure that is usable in a magnetic memory programmable using spin transfer torque during switching. For clarity, FIGS. 10A and 10B are not to scale. The magnetic junction 400 may be used in a magnetic device such as a STT-RAM and, therefore, in a variety of electronic devices. The magnetic junction 400 is analogous to the magnetic junction 100. As a result, similar components have similar labels. The magnetic junction 400 includes a SI substructure 410, a nonmagnetic spacer layer 420, a free layer 430 having magnetic moment 431, a nonmagnetic spacer layer 440 and a reference layer 450 having magnetic moment 451 that are analogous to the SI substructure 110, nonmagnetic spacer layer 120, free layer 130 having magnetic moment 131, the nonmagnetic spacer layer 140, and the reference layer 150 having magnetic moment 151, respectively, depicted in FIG. 2. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 450 and the nonmagnetic spacer layer 440, between the free layer 430 and the nonmagnetic spacer layer 440, between the free layer 430 and the nonmagnetic spacer layer 420 and/or between the SI substructure 410 and the nonmagnetic spacer layer 420. In addition, although it appears as though the SI substructure 410 would be closest to the substrate (not shown in FIGS. 10A-10B) and the reference layer 450 furthest from the substrate, other relationships may be possible. For example, the reference layer 450 may be closest to the substrate and the SI substructure 410 may be furthest from the substrate.

The reference layer 450 and free layer 430 each have a high PMA in the embodiment shown. Thus, the magnetic moments 451 and 431 are perpendicular to plane. In other embodiments, the magnetic moments 451 and 431 might be in plane. The free layer 430 and/or reference layer 450 may thus include one or more multilayers which are known to have a high perpendicular magnetic anisotropy. In addition, the materials selected for the free layer 430, reference layer 450 and nonmagnetic spacer layers 420 and 440 are desired to produce not only spin transfer torque programming, but also a high magnetoresistance. For example, the nonmagnetic spacer layers 420 and 440 may be crystalline MgO having the desired (e.g. 200) orientation and the free layer 4230 and reference layer 450 may include CoFe and/or CoFeB. The magnetic moment 431 of the free layer 430 is programmable using a current driven through the magnetic junction 400 in a perpendicular-to-plane direction (i.e. along the z-axis). A write current driven through a magnetic junction is driven perpendicular-to-plane unless otherwise noted. The magnetic moment 431 switches for a write current having a critical magnitude.

The SI substructure 410 is analogous to the third SI substructure described above with respect to the magnetic junction 100. The SI substructure 410 is a thermally sensitive SI reference layer 410. When the magnetic junction 400 is in standby mode/quiescent, as shown in FIG. 10A, the magnetic moment 411 of the thermally sensitive SI reference layer 410 may be in plane, substantially zero or unstable. For example, a ferrimagnetic material such as CoTbFeB may be used or the SI reference layer 410. The stoichiometry of this ferrimagnet may, for example be $Tb_{1-x-z}(Fe_{1-y}Co_y)_xB_z$, where x is at least 0.5 and not more than 0.85, y is at least 0.2 and not more than 0.5, and z is at least 0.0 and not more than 0.3.

When a write current is driven through the magnetic junction 400, the magnetic junction 400 undergoes Joule heating. Alternatively or in addition to this Joule heating, an external source of heat may be used during programming. Because of this heating, the saturation magnetization of the thermally sensitive SI reference layer 410 drops, therefore the switching current of the thermally sensitive SI reference layer reduces. The write current through the magnetic junction 400 may also align the magnetic moment 411 antiparallel to the magnetic moment 451 in a manner analogous to the SI reference layer 212 described above The magnetic moments 411 and 451 may thus be in a dual state. Consequently, STT programming of the free layer 430 may be improved.

The magnetic junction 400 may have improved performance. The SI reference layer 410 may provide the desired dual configuration for the magnetic moments 411 and 451 without substantially increasing the height of the stack of layers 410 through 450 for the magnetic junction 400. Thus, fabrication may be facilitated while performance is improved.

Figure 11:
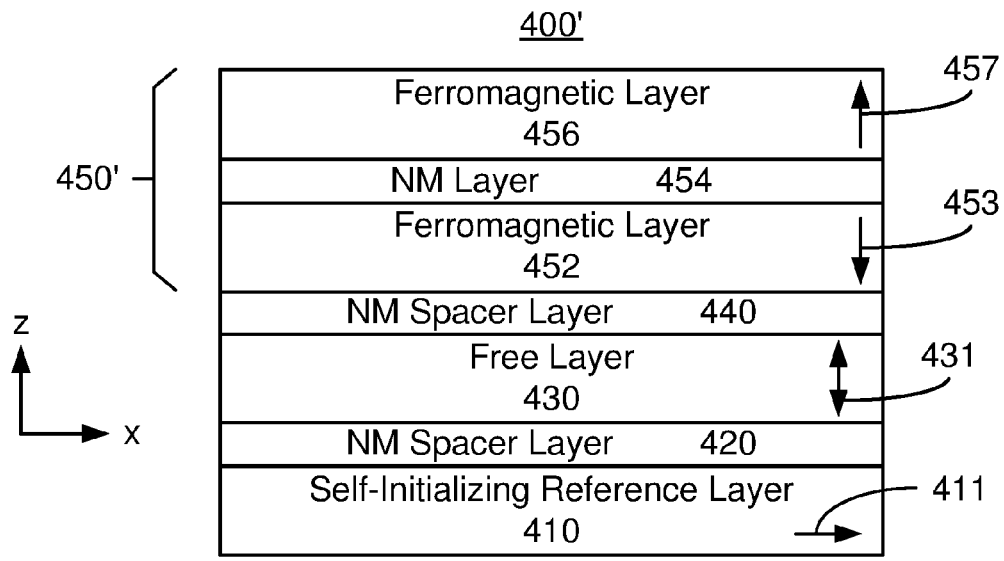
FIG. 11 depicts another exemplary embodiment of a dual magnetic junction including a self-initializing substructure that is usable in a magnetic memory programmable using spin transfer torque.

FIG. 11 depicts another exemplary embodiment of a dual magnetic junction 400' including a self-initializing substructure that is usable in a magnetic memory programmable using spin transfer torque. For clarity, FIG. 11 is not to scale. The magnetic junction 400' may be used in a magnetic device such as a STT-RAM and, therefore, in a variety of electronic devices. The magnetic junction 400' is analogous to the magnetic junctions 100 and 400. As a result, similar components have similar labels. The magnetic junction 400' includes a SI substructure 410, a nonmagnetic spacer layer 420, a free layer 430 having magnetic moment 431, a nonmagnetic spacer layer 440 and a reference layer 450' that are analogous to the SI substructure 110/410, nonmagnetic spacer layer 120/420, free layer 130/430 having magnetic moment 131/431, the nonmagnetic spacer layer 140/440, and the reference layer 150/450 having magnetic moment 151/451, respectively, depicted in FIGS. 2 and 10A-10B. Although not shown, an underlying substrate, bottom contact, top contact, optional seed layer(s), and optional capping layer(s) that are analogous to the substrate 101, bottom contact 102, top contact 108, optional seed layer(s) 104 and optional capping layer 106 shown in FIG. 2 might be included. In addition, one or more PELs (not shown) may be present. For example, a PEL may be provided between the reference layer 450' and the nonmagnetic spacer layer 440, between the free layer 430 and the nonmagnetic spacer layer 440, between the free layer 430 and the nonmagnetic spacer layer 420 and/or between the SI substructure 410 and the nonmagnetic spacer layer 420. In addition, although it appears as though the SI substructure 410 would be closest to the substrate (not shown in FIG. 11) and the reference layer 450' furthest from the substrate, other relationships may be possible. For example, the reference layer 450' may be closest to the substrate and the SI substructure 410 may be furthest from the substrate.

The magnetic junction 400' operates in an analogous manner to the magnetic junction 400. In the embodiment shown, however, the reference layer 450' is a SAF. Thus, the reference layer 450' includes ferromagnetic layers 452 and 456 separated by the nonmagnetic layer 454 that may be Ru. Thus, the magnetic moments 453 and 457 of the layers 452 and 456, respectively, are antiferromagnetically coupled.

The magnetic junction 400' shares the benefits of the magnetic junction 400. Thus, fabrication of the magnetic junction 400' may be facilitated while performance is improved.

Various configurations of the magnetic junction(s) 100, 200, 200', 200'', 300, 300', 400 and/or 400' are highlighted. One of ordinary skill in the art will recognize that various features of the magnetic junction(s) 100, 200, 200', 200'', 300, 300', 400 and/or 400' may be combined in manners not specifically described herein. Thus, one or more of the benefits described herein may be achieved using other configurations.

Figure 12:
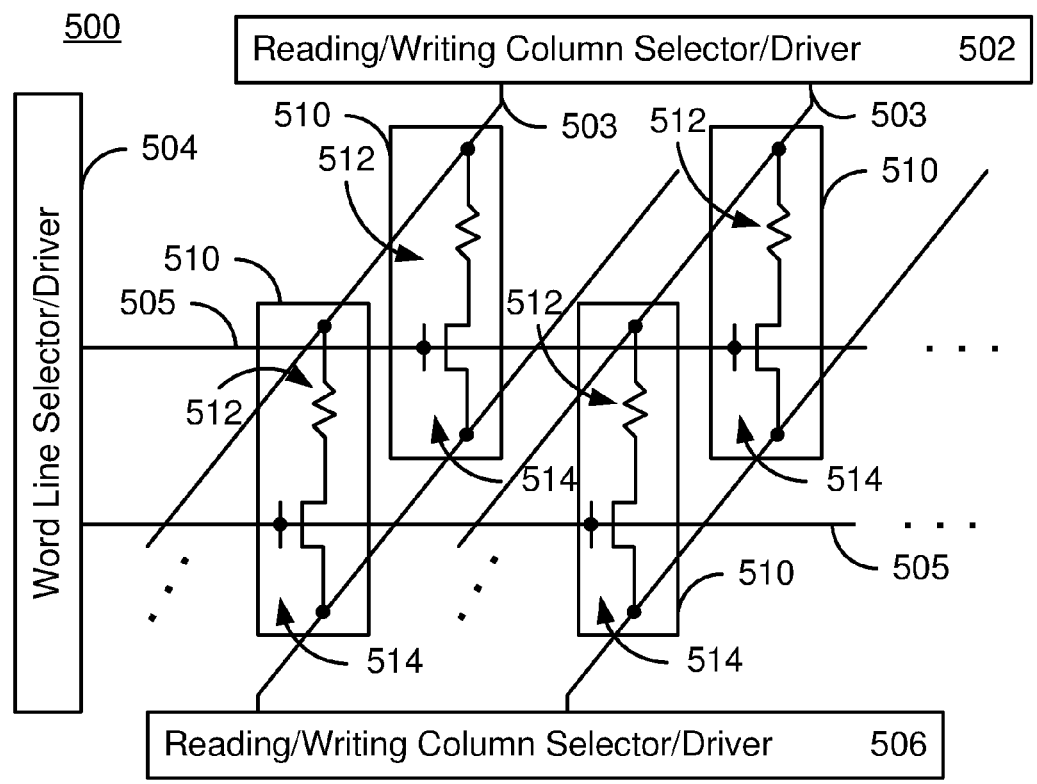
FIG. 12 depicts an exemplary embodiment of a memory utilizing magnetic junctions in the memory element(s) of the storage cell(s).

FIG. 12 depicts an exemplary embodiment of a memory 500 that may use one or more of the magnetic junctions 100, 200, 200', 200'', 300, 300', 400 and/or 400'. The magnetic memory 500 includes reading/writing column select drivers 502 and 506 as well as word line select driver 504. Note that other and/or different components may be provided. The storage region of the memory 500 includes magnetic storage cells 510. Each magnetic storage cell includes at least one magnetic junction 512 and at least one selection device 514. In some embodiments, the selection device 514 is a transistor. The magnetic junctions 512 may be one of the magnetic junctions 100, 200, 200', 200'', 300, 300', 400 and/or 400' disclosed herein. Although one magnetic junction 512 is shown per cell 510, in other embodiments, another number of magnetic junctions 512 may be provided per cell. As such, the magnetic memory 500 may enjoy the benefits described above.

Figure 13:
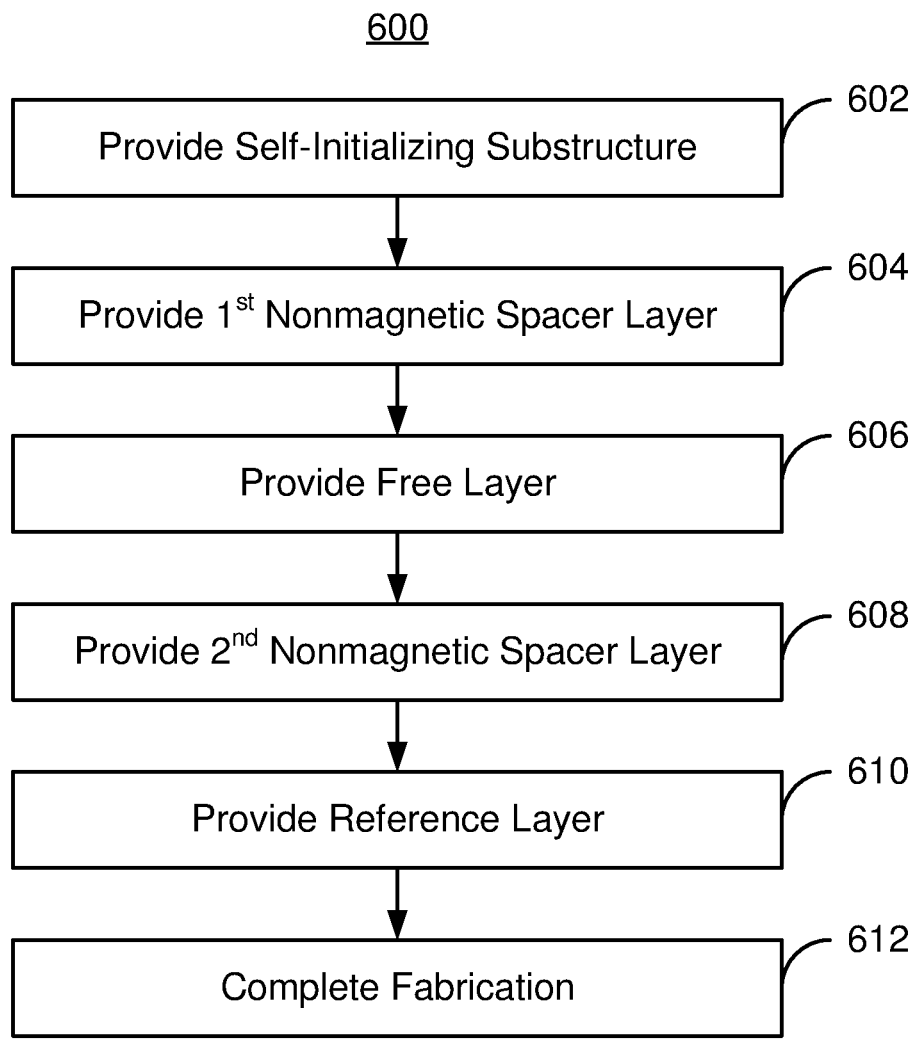
FIG. 13 is a flow chart depicting an exemplary embodiment of a method for providing a dual magnetic junction including a self-initializing substructure that is usable in a magnetic memory programmable using spin transfer torque.

FIG. 13 depicts an exemplary embodiment of a method 600 for fabricating a magnetic junction including SI substructure(s) and usable in a magnetic device such as a spin transfer torque random access memory (STT-RAM) and, therefore, in a variety of electronic devices. For simplicity, some steps may be omitted, performed in another order, include substeps and/or combined. Further, the method 600 may start after other steps in forming a magnetic memory have been performed. For simplicity, the method 600 is described in the context of the magnetic junction 100. However, other magnetic junctions, including but not limited to the magnetic junction(s) 200, 200', 200'', 300, 300', 400 and/or 400', may be formed.

The self-initializing substructure 110 may be provide, via step 602. Thus, one or more of the structures 110, 210, 210', 210'', 310 and/or 410 may be fabricated.

A nonmagnetic spacer layer 120 is provided, via step 604. Step 604 may include depositing MgO, which forms a tunneling barrier layer. In some embodiments, step 604 may include depositing MgO using, for example, radio frequency (RF) sputtering. In other embodiments, metallic Mg may be deposited, then oxidized in step 604.

A free layer 130 is provided, via step 606. The nonmagnetic spacer layer 120 is between the SI substructure 110 and the free layer 130. The PMA energy of the free layer 130 may be greater than its demagnetization energy. Thus, the magnetic moment 131 may be perpendicular to plane.

The nonmagnetic spacer layer 140 is provided, via step 608. Step 608 is analogous to step 604. In addition, annealing, or otherwise providing adequate energy for crystallization, may be performed for the spacer layer 140.

A reference layer 150 that may have its PMA exceeding its out-of-plane demagnetization energy is provided on the substrate, via step 610. The nonmagnetic spacer layer 140 is between the reference layer 150 and the free layer 130. In some embodiments, step 610 may include providing a multilayer such as a SAF, a high PMA multilayer, and/or another multilayer. In some embodiments, the reference layer 130 may not be a SAF, but the stray fields from the magnetic junction 100 may still be substantially balanced at the free layer 130 because of the material(s) and/or other structures formed. Step 610 is performed such that the reference layer 150 is thermally stable during operation.

In some embodiments steps 602 is performed before step 604; step 604 is performed before step 606; step 606 is performed before step 608 and step 608 is performed before step 610. However, other orders are possible. For example, if the reference layer 150 is closest to the substrate, then the order of steps 602, 604, 606, 608 and 610 may be reversed.

Fabrication of the magnetic junction 100 may be completed, via step 612. Step 612 may include substeps interleaved with the remaining steps. For example, step 612 may include providing the PEL 142. This may occur between portions of steps 602 and 604. One or more anneals may also be carried out during fabrication using step 612. In addition, the edges of the magnetic junction 100 may be defined in step 612. For example, a mask may be provided on the stack of layers for the magnetic junction 100. The mask covers region(s) to be formed into magnetic junctions 100 and has apertures over regions between the magnetic junctions. An ion mill may then be performed. The regions between the magnetic junctions may be refilled and/or other structures formed. Thus, fabrication of the magnetic junction is completed.

Using the method 600, the magnetic junction 100, 200, 200', 200", 300, 300', 400 and/or 400' may be formed. Thus, the benefits of the magnetic junction(s) 200, 200', 200", 200''', 200'''', 300 and/or 300' may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device, the magnetic junction comprising:
    a first reference layer having a first magnetic moment fixed in a first direction;
    a first nonmagnetic spacer layer;
    a free layer, the first nonmagnetic spacer layer being between the free layer and the first reference layer, the free layer being switchable between a plurality of stable magnetic states when a write current having at least a critical magnitude is passed through the magnetic junction;
    a second nonmagnetic spacer layer, the free layer being between the first nonmagnetic spacer layer and the second nonmagnetic spacer layer; and
    a self-initializing (SI) substructure, the second nonmagnetic spacer layer being between the SI substructure and the free layer, the SI substructure functioning as a reference layer but having an SI substructure magnetic moment that is not fixed, the SI substructure being selected from a first SI substructure, a second SI substructure and a third SI substructure;
    the first SI substructure including an SI reference layer, a decoupling layer and a second reference layer, the second reference layer having a second magnetic moment fixed in a second direction, the SI reference layer being between the free layer and the second reference layer, the decoupling layer being nonmagnetic and between the SI reference layer and the second reference layer, the SI reference layer having an SI magnetic moment switchable between the first direction and the second direction when a current having a magnitude of not more than one-half of the critical magnitude is passed through the magnetic junction;
    the second SI substructure including the SI reference layer and being usable only if the first reference layer is selected from a low saturation magnetization reference layer and an extended reference layer, the low saturation magnetization reference layer having a saturation magnetization of not more than four hundred emu/cc, the extended reference layer having a footprint larger than the free layer;
    the third SI substructure including a temperature dependent reference layer, the temperature dependent reference layer having a first magnetic moment at room temperature and a second magnetic moment at a switching temperature, the first magnetic moment being in a third direction, the second magnetic moment being in a fourth direction, the fourth direction being parallel one of the first direction and the second direction.

2. The magnetic junction of claim 1 wherein the SI substructure is the first SI substructure and wherein the SI reference layer is switchable between the first direction and the second direction when a current having a magnitude of not more than one-third of the critical magnitude is passed through the magnetic junction.

3. The magnetic junction of claim 2 wherein the decoupling layer includes at least one of CoFeBTa, a Fe/Ta bilayer, a CoFeBTa/Mg bilayer, a CoFeBTa/MgO bilayer, a [Fe/Ta]$_x$ Mg multilayer and a [Fe/Ta]$_x$/MgO multilayer where x is an integer.

4. The magnetic junction of claim 2 wherein the SI reference layer includes at least one of CoFe, CoFeB, CoFeV and CoFeTa having a Ta content of less than thirty atomic percent.

5. The magnetic junction of claim 4 wherein the second reference layer includes at least one of n repeats of a TbCo/FeB bilayer and m repeats of a CoFe/PtPd bilayer, where n and m are each integers.

6. The magnetic junction of claim 2 wherein the first direction and the second direction are perpendicular to plane and wherein the SI magnetic moment is in-plane when no current is driven through the magnetic junction.

7. The magnetic junction of claim 2 further comprising:
a polarization enhancement layer between the first reference layer and the first nonmagnetic spacer layer.

8. The magnetic junction of claim 2 wherein the first reference layer excludes a synthetic antiferromagnet.

9. The magnetic junction of claim 2 wherein the first magnetic moment and the second magnetic moment are antiferromagnetically aligned.

10. A magnetic memory residing on a substrate, the magnetic memory comprising:
a plurality of magnetic storage cells, each of the plurality of magnetic storage cells including at least one magnetic junction, the at least one magnetic junction including a first reference layer, a first nonmagnetic spacer layer, a free layer, a second nonmagnetic spacer layer and a self-initializing (SI) substructure, the first reference layer having a first magnetic moment fixed in a first direction, the first nonmagnetic spacer layer being between the free layer and the reference layer, the free layer being switchable between a plurality of stable magnetic states when a write current having at least a critical magnitude is passed through the magnetic junction, the free layer being between the first nonmagnetic spacer layer and the second nonmagnetic spacer layer, the second nonmagnetic spacer layer being between the SI substructure and the free layer, the SI substructure functioning as an additional reference layer but having an SI substructure magnetic moment that is not fixed, the SI substructure being selected from a first SI substructure, a second SI substructure and a third SI substructure; and
a plurality of bit lines coupled with the plurality of magnetic storage cells;
wherein the first SI substructure includes an SI reference layer, a decoupling layer and a second reference layer, the second reference layer having a second magnetic moment fixed in a second direction, the SI reference layer being between the free layer and the second reference layer, the decoupling layer being nonmagnetic and between the SI reference layer and the second reference layer, the SI reference layer having an SI magnetic moment switchable between the first direction and the second direction when a current having a magnitude of not more than one-half of the critical magnitude is passed through the magnetic junction;
wherein the second SI substructure includes the SI reference layer and is usable only if the first reference layer is selected from a low saturation magnetization reference layer and an extended reference layer, the low saturation magnetization reference layer having a saturation magnetization of not more than four hundred emu/cc, the extended reference layer having a footprint larger than the free layer; and
wherein the third SI substructure includes a temperature dependent reference layer, the temperature dependent reference layer having a first magnetic moment at room temperature and a second magnetic moment at a switching temperature, the first magnetic moment being in a third direction, the second magnetic moment being in a fourth direction, the fourth direction being parallel one of the first direction and the second direction.

11. A method for providing a magnetic junction residing on a substrate and usable in a magnetic device, the method comprising:
providing a first reference layer having a first magnetic moment fixed in a first direction;
providing a first nonmagnetic spacer layer;
providing a free layer, the first nonmagnetic spacer layer being between the free layer and the reference layer, the free layer being switchable between a plurality of stable magnetic states when a write current having at least a critical magnitude is passed through the magnetic junction;
providing a second nonmagnetic spacer layer, the free layer being between the first nonmagnetic spacer layer and the second nonmagnetic spacer layer; and
providing a self-initializing (SI) substructure, the second nonmagnetic spacer layer being between the SI substructure and the free layer, the SI substructure functioning as an additional reference layer but having an SI substructure magnetic moment that is not fixed, the SI substructure being selected from a first SI substructure, a second SI substructure and a third SI substructure,
wherein the first SI substructure includes an SI reference layer, a decoupling layer and a second reference layer, the second reference layer having a second magnetic moment fixed in a second direction, the SI reference layer being between the free layer and the second reference layer, the decoupling layer being nonmagnetic and between the SI reference layer and the second reference layer, the SI reference layer having an SI magnetic moment switchable between the first direction and the second direction when a current having a magnitude of not more than one-half of the critical magnitude is passed through the magnetic junction;
wherein the second SI substructure includes the SI reference layer and is usable only if the first reference layer is selected from a low saturation magnetization reference layer and an extended reference layer, the low saturation magnetization reference layer having a saturation magnetization of not more than four hundred emu/cc, the extended reference layer having a footprint larger than the free layer; and
wherein the third SI substructure includes a temperature dependent reference layer, the temperature dependent reference layer having a first magnetic moment at room temperature and a second magnetic moment at a switching temperature, the first magnetic moment being in a third direction, the second magnetic moment being in a fourth direction, the fourth direction being parallel one of the first direction and the second direction.

12. The method of claim 11 wherein the SI substructure is the first SI substructure and wherein the SI reference layer is switchable between the first direction and the second direction when a current having a magnitude of not more than one-third of the critical magnitude is passed through the magnetic junction.

13. The method of claim 12 wherein the decoupling layer includes at least one of CoFeBTa, a Fe/Ta bilayer, a CoFeBTa/Mg bilayer, a CoFeBTa/MgO bilayer, a $[Fe/Ta]_x$ Mg multilayer and a $[Fe/Ta]_x$/MgO multilayer where x is an integer.

14. The method of claim 12 wherein the SI reference layer includes at least one of CoFe, CoFeB, CoFeV and CoFeTa with Ta content less than thirty atomic percent.

15. The method of claim 14 wherein the second reference layer includes at least one of n repeats of a TbCo/FeB bilayer and m repeats of a CoFe/PtPd bilayer, where n and m are each integers.

16. The method of claim 12 wherein the first direction and the second direction are perpendicular to plane and wherein the SI magnetic moment is in-plane when no current is driven through the magnetic junction.

17. The method of claim 12 further comprising:
a polarization enhancement layer between the first reference layer and the first nonmagnetic spacer layer.

18. The method of claim 12 wherein the first reference layer excludes a synthetic antiferromagnet.

19. The method of claim 12 wherein the first magnetic moment and the second magnetic moment are antiferromagnetically aligned.

* * * * *